(12) United States Patent
Norte et al.

(10) Patent No.: US 6,972,967 B2
(45) Date of Patent: Dec. 6, 2005

(54) EMC/ESD MITIGATION MODULE

(75) Inventors: David A. Norte, Westminster, CO (US); Woong K. Yoon, Westminster, CO (US); Thu-Duyen Ngoc Tran, Denver, CO (US)

(73) Assignee: Avaya Technology Group, Basking Ridge, NJ (US)

( * ) Notice: Subject to any disclaimer, the term of this patent is extended or adjusted under 35 U.S.C. 154(b) by 239 days.

(21) Appl. No.: 10/372,058

(22) Filed: Feb. 20, 2003

(65) Prior Publication Data

US 2004/0165368 A1 Aug. 26, 2004

(51) Int. Cl.$^7$ .............................................. H05K 9/00
(52) U.S. Cl. ...................... 361/818; 361/816; 361/800; 361/821; 361/799; 174/32; 174/35 R; 174/35 GC
(58) Field of Search ................................ 361/800, 816, 361/818, 804, 799, 796, 795, 770, 766, 762, 361/763, 271, 742, 758, 782, 746, 821; 174/32, 174/35 R, 35 GC, 35 MS; 331/67; 307/91; 334/85

(56) References Cited

U.S. PATENT DOCUMENTS

| | | | | |
|---|---|---|---|---|
| 3,638,147 A | * | 1/1972 | Denes ......................... | 333/182 |
| 4,855,873 A | * | 8/1989 | Bhargava et al. ........... | 361/818 |
| 5,293,145 A | * | 3/1994 | Rynkiewicz ................. | 336/65 |
| 5,757,258 A | * | 5/1998 | Krichtafovitch et al. ...... | 336/65 |
| 5,978,231 A | * | 11/1999 | Tohya et al. ................ | 361/782 |
| 6,687,127 B2 | * | 2/2004 | Takami ....................... | 361/719 |

* cited by examiner

Primary Examiner—Kamand Cuneo
Assistant Examiner—Dameon E. Levi
(74) Attorney, Agent, or Firm—Sheridan Ross P.C.

(57) ABSTRACT

An assembly for mitigating at least one of an electrostatic discharge and electromagnetic interference is provided. The assembly includes (a) first and second spaced apart electrical conductors 108 and 116 and (b) a mitigation module 300 electrically coupled to the first and second spaced apart electrical conductors to control a magnitude of an electrostatic discharge and/or electromagnetic interference in the first and second electrical conductors 108 and 116. One or more of the following statements is true: (i) the mitigation module 300 comprises a ferrite material 304; (ii) the mitigation module 300 comprises a lossy dielectric material 308; and (iii) an equivalent electrical circuit for at least part of the mitigation module 300 comprises at least a first circuit segment 512 comprising a first inductor and a first capacitor electrically connected in parallel and a second capacitor 504 electrically connected in series with the first circuit segment 512. The first and second electrical conductors can be, for example, a ground plane of a printed circuit board 108 and a wall of the enclosure or chassis 116.

52 Claims, 7 Drawing Sheets

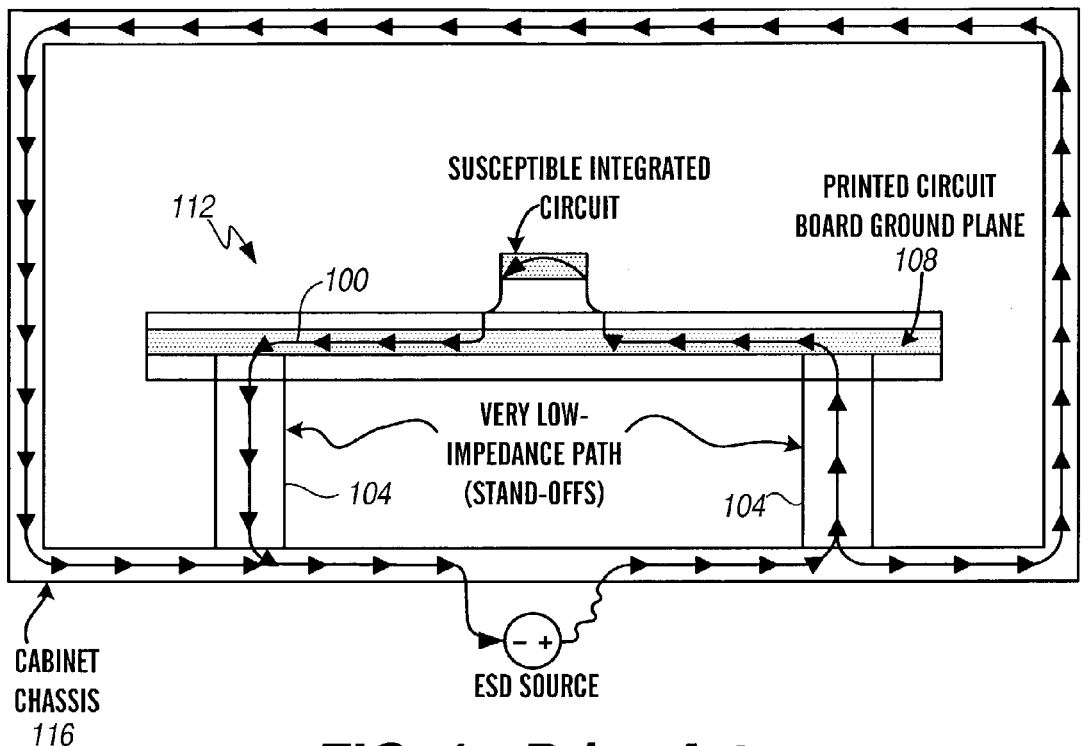
FIG. 1 - Prior Art
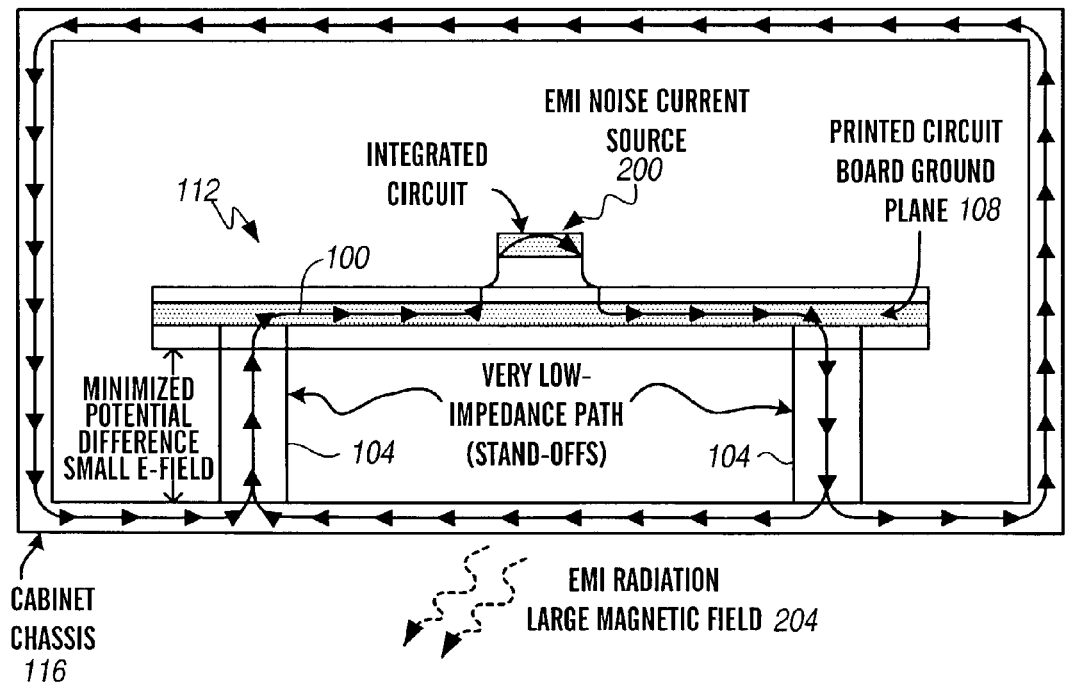
FIG. 2 - Prior Art

EMC/ESD MITIGATION MODULE

FIELD OF THE INVENTION

The present invention relates generally to modules for protecting electronic devices from electromagnetic energy and specifically to a module for protecting printed circuit boards (PCBs) from electrostatic discharge (ESD) and electromagnetic incompatibility.

BACKGROUND OF THE INVENTION

Printed circuit boards (PCBs) housed within metal enclosures must comply with electrostatic discharge (ESD) and electromagnetic compatibility (EMC) requirements. To comply with these requirements, the PCBs must not malfunction in the presence of electrical discharges that are coupled onto the metal enclosures, and the PCBs must not emit excessive radiation outside of the metal enclosures.

In an EMC compliance approach, the PCBs ground plane (s) are electrically connected to the enclosure's chassis, thereby reducing electric-field radiation. The interconnection of the ground plane with the chassis equalizes potential differences that may exist between the PCB and the enclosure's chassis. The interconnection is typically implemented as a series of tapped (conductive) metal standoffs spaced periodically throughout the chassis. The PCB is placed on top of the array of metal standoffs, and the alignment holes within the PCB are aligned with and receive the standoffs. The holes are copper plated and connected to the PCB's ground plane. Metal screws attach the ground plane to the standoffs.

Although this approach reduces certain types of electric-field radiation, it compromises compliance with certain ESD/EMC requirements. The PCB's robustness against ESD discharges is compromised because the metal standoffs provide a low-impedance path. As shown in FIG. 1, the low-impedance path 100 passes through the low impedance standoffs 104, the ground plane 108 of the PCB 112, and the chassis 116. Current from an electrostatic discharge to the chassis 116 can freely travel along the path 100. The path enables excellent coupling of electrostatic discharge from the chassis 116 to the PCB 112. This coupling allows ESD currents to flow from the chassis onto the PCB, possibly causing PCB malfunction. Also, this coupling allows PCB noise currents to be coupled onto the chassis, allowing radiation of magnetic fields into the surrounding environment. As shown in FIG. 2, the low impedance path 100 conducts the noise current generated by the EMI noise current source 200 to the chassis 116, thereby causing EMI radiation 204 to be emitted from the chassis 116 into the surrounding environment. In practice, designers typically rely on trial and error approaches to determine where the periodically spaced metal standoffs can be electrically connected to the PCB's ground plane(s) without compromising protection against ESD discharges and mitigation against electromagnetic interference (EMI).

In an ESD compliance approach, electrically insulating standoffs, characterized by extremely large impedances, are used to electrically isolate the PCB from the chassis. In this manner, any electrical discharges directly onto the chassis are unable to couple onto the PCB, and any noise currents generated by the PCB are unable to couple to the chassis. The use of such insulative standoffs can compromise EMC compliance. The standoffs will maximize potential differences between the PCB and the chassis and cause excessive radiation of electric fields as a result of the large potential differences.

There is thus a need for a mitigation module that will provide concurrent compliance with both ESD and EMC requirements rather than compromising compliance with one set of requirements in lieu of ensuring compliance with another.

SUMMARY OF THE INVENTION

These and other needs are addressed by the various embodiments and configurations of the present invention. The present invention provides a mitigation module that provides a medium amount of impedance between the ground plane and the chassis to mitigate EMI and ESD currents while also mitigating potential differences between the PCB and the chassis.

In one embodiment, an assembly for mitigating the magnitude of an electrostatic discharge and/or electromagnetic interference signal is provided. The assembly includes:

(a) first and second spaced apart electrical conductors and (b) a mitigation module electrically coupled to the first and second spaced apart electrical conductors to control the magnitude of any electrostatic discharge and/or electromagnetic interference in the first and second electrical conductors. One or more of the following statements is true: (i) the mitigation module comprises a ferrite material; (ii) the mitigation module comprises a lossy dielectric material; and (iii) an equivalent electrical circuit for at least part of the mitigation module comprises at least a first circuit segment comprising a first inductor and a first capacitor electrically connected in parallel and a second capacitor electrically connected in series with the first circuit segment. The first and second electrical conductors can be, for example, a ground plane of a printed circuit board and a wall of the enclosure or chassis. The module can provide engineers with the capability of connecting every metal standoff to the PCB's ground plane(s) while simultaneously achieving robust protection against ESD and realizing electromagnetic compatibility.

The module can be configured in many different ways. By way of illustration, the module can be configured as a through-hole device, a PCB surface mountable device, and/or as all or part of the standoff itself. The surface mountable design is generally preferred because it can more readily be miniaturized (thereby conserving invaluable space on the PCB) and, compared to a through-hole device, require less labor and fewer steps (and therefore is cheaper) to mount on the PCB. The surface mountable design more readily lends itself to automated placement of the module on the PCB, which is often crowded with other electrical circuitry.

By selecting appropriate materials for the ferrite and dielectric, the module can be tuned to satisfy a broad variety of design criteria. The module can be configured to provide neither a very high nor a very low impedance to the three types of ESD and EMI signals. The module effectively provides a medium impedance barrier to all three types of signals.

The module is tunable or configurable to behave differently, depending on the application. For instance, in applications where EMI is of greater concern, the module can be designed to allow better EMC performance and less ESD performance. In applications where ESD is of greater concern, the module can be designed to allow better ESD performance and less EMC performance. The module can thus be designed to satisfy concurrently both EMC and ESD requirements.

These and other advantages will be apparent from the disclosure of the invention(s) contained herein.

The above-described embodiments and configurations are neither complete nor exhaustive. As will be appreciated, other embodiments of the invention are possible utilizing, alone or in combination, one or more of the features set forth above or described in detail below.

BRIEF DESCRIPTION OF THE DRAWINGS

FIG. 1 shows a PCB mounting design according to the prior art;

FIG. 2 is another view of the PCB mounting scheme of FIG. 1;

DETAILED DESCRIPTION

Figure 3:
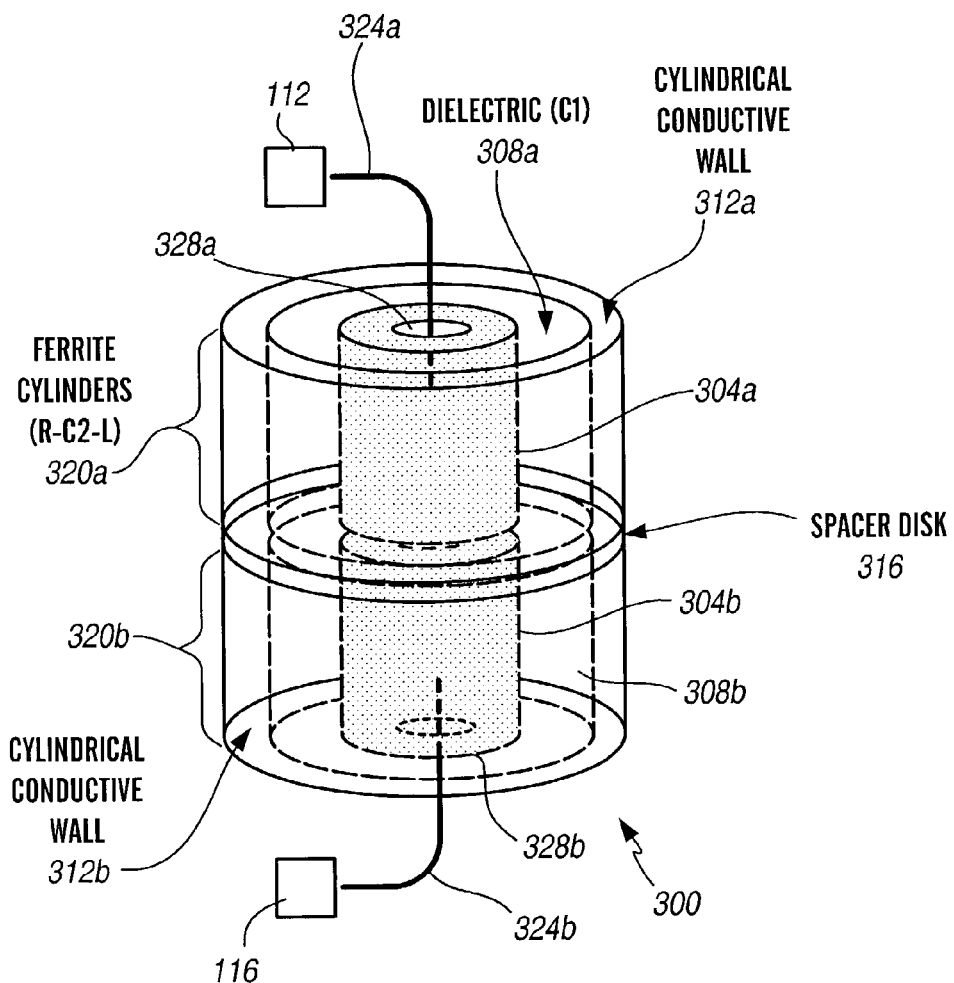
FIG. 3 is a perspective view of a mitigation module according to a first embodiment of the present invention.
Figure 4:
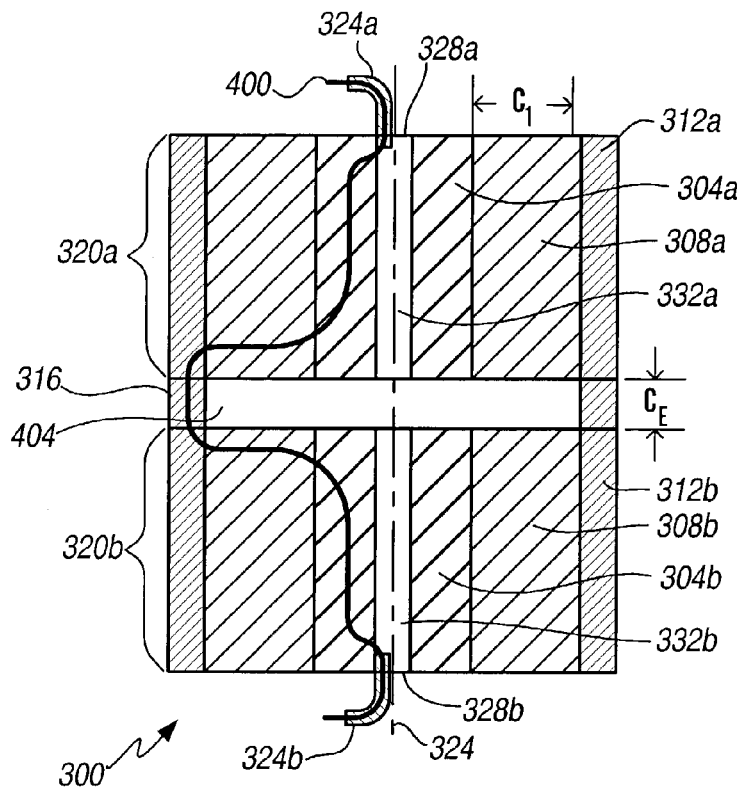
FIG. 4 is a cross-section along line 4—4 of FIG. 3.

FIGS. 3 and 4 depict a cylindrical through-hole mitigation module according to a first embodiment of the present invention. The mitigation module 300 comprises first and second (co-axially aligned) ferrite cores 304a and b, first and second (co-axially aligned) dielectric materials 308a and b surrounding the peripheries of the first and second ferrite cores 304a and b, respectively, first and second (co-axially aligned) outer conductive (e.g., metal) shells 312a and b surrounding the peripheries of the first and second dielectric materials 308a and b, respectively, and a conductive (e.g., metal) annular spacer disk 316 positioned between the first and second sections 320a and b of the module. The first and second ferrite cores 304a and b, first and second dielectric materials 308a and b, first and second outer conductive shells 312a and b, and conductive spacer disk 316 are, in one configuration, co-axially aligned along line 324.

Figure 5:
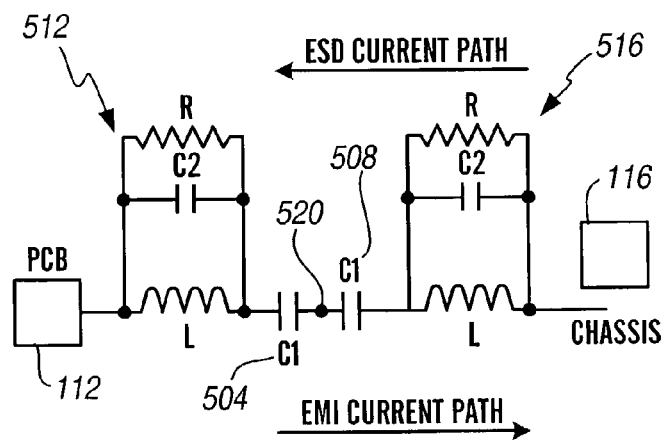
FIG. 5 is an equivalent electrical circuit for the mitigation module of FIG. 3.

The electrical behavior of the module 300 is depicted in FIG. 5. The first capacitor $C_1$ 504 is defined by the first ferrite core 304a, the first dielectric material 308a and the first outer conductive shell 312a, and the second capacitor 508 by the second ferrite core 304b, the second dielectric material 308b, and the second outer conductive shell 312b.

The first parallel R-$C_2$-L circuit 512 is the equivalent electrical circuit for the first ferrite core 304a, and the second parallel R-$C_2$-L circuit 516 is the equivalent electrical circuit for the second ferrite core 304b. The connection 520 between the left and right hand circuits represents the conductive spacer disk 316. The spacer disk 316 electrically connects only the first outer shell 312a to the second outer shell 312b to allow current to flow from the first section 320a to the second section 320b and vice versa and can be bonded to the first and second outer shells metallurgically or the spacer 316, and the first and second outer shells can be fabricated as one (an integral) unit using existing capacitor manufacturing processes.

While not wishing to be bound by any theory, the module 300 provides a medium impedance barrier for both ESD signals and EMI signals while mitigating potential differences between the PCB 112 and the chassis 116. As will be appreciated, ESD signal frequencies typically fall between about 200 Hz and 30 MHZ while EMI frequencies fall between about 30 MHZ and 1,000 MHZ. To produce this behavior, the first and second capacitors 504 and 508 are each tuned to provide at least about 10,000 ohms of impedance at signal frequencies up to about 30 MHZ to attenuate ESD signals, and the first and second parallel R-$C_2$-L circuits 512 and 516 are each tuned to provide between about 1,500 ohms and 10,000 ohms of impedance at signal frequencies between about 30 MHZ and 1,000 MHZ to attenuate EMI signals.

Figure 6:
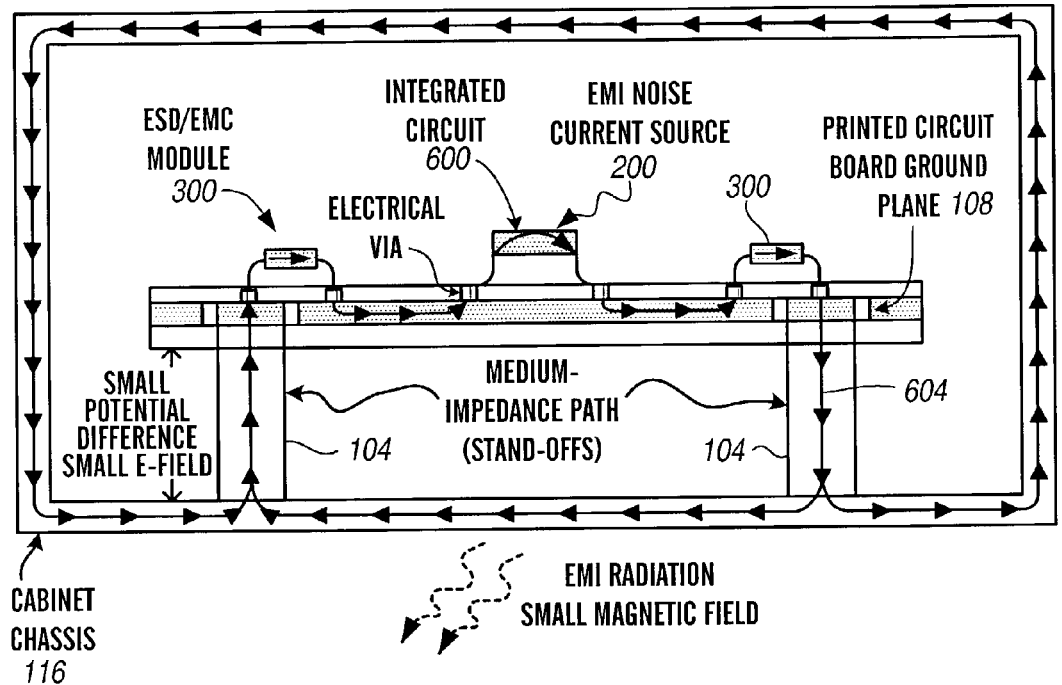
FIG. 6 is a PCB mounting design according to the first embodiment.
Figure 7:
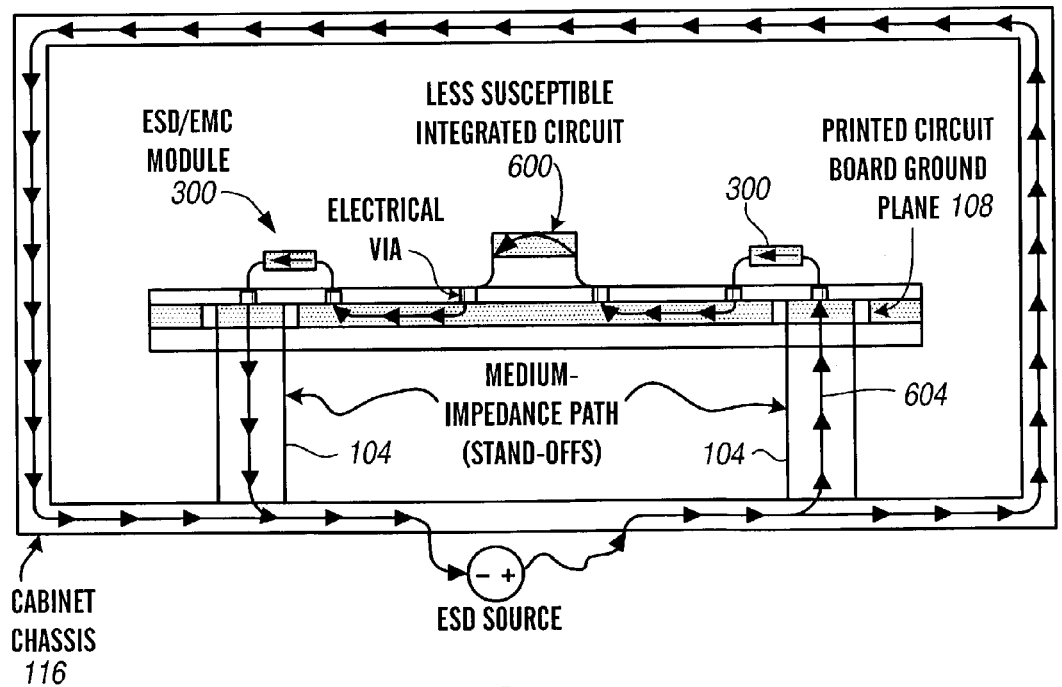
FIG. 7 is another view of the PCB mounting design of FIG. 6.

The performance of the module 300 will now be described with reference to FIGS. 6 and 7. As can be seen from the Figures, the module 300 is placed on the PCB. The through-hole leads 324a and b (FIG. 3) are metallurgically attached to each end 328a and b of the inner cylindrical holes 332a and b of the first and second ferrite cores 332a and b, respectively. The modules 300, PCB ground plane 108, integrated circuit 600, standoffs 104, and chassis 116 form a medium-impedance path 604. For EMI noise currents, the current flow is depicted in FIG. 6. For ESD discharge currents, the current flow (which is in a direction opposite to the direction of flow of EMI noise currents) is depicted in FIG. 7. FIG. 4 depicts the segment 400 of the path 604 passing through the module 300.

To cause the path 604 to have the configuration shown in FIG. 4, the capacitance $C_E$ is selected to be less than the capacitance $C_1$. This prevents the current flowing along the path segment 400 from flowing directly from one of the ferrite cores to the other ferrite core and not passing through the dielectric materials and spacer ring. This can be done by selecting a suitable width of the gap 404 between the ferrite cores and/or dielectric material (not shown) in the gap 404.

The various module components are carefully selected to produce these design parameters.

The material(s) used in first and second outer conductive shells 312a and b and the spacer ring 316 is/are selected to have relatively high conductivities (preferably of at least about 10 million siemens/meter) and therefore high conductivity. Preferably, the material is a conductive metal such as aluminum or copper.

The ferrite core 304 can be formed from any suitable ferrite material. Preferably, the ferrite in the ferrite core 304 has a resistivity of no more than about 10,000 ohm-meters. Preferred ferrite materials are manganese-zinc-based ferrites, such as 3S1 and 3S4 manufactured by Phillips. Such conductive ferrites can perform two important functions. First, the first and second ferrite cores 304a and b serve as the inner conductor for the capacitors 504 and 508 (FIG. 5), respectively. Second, the first and second ferrite cores 304a and *b* provide a medium impedance barrier to the high-frequency EMI currents attempting to flow from the PCB 112 to the chassis 116.

The first and second dielectric materials 308*a* and *b* can be any dielectric material, however, lossy dielectric materials would be preferred, such as lossy ceramic (e.g., glass) dielectrics. Lossy dielectrics absorb a given percentage of the currents flowing through them by converting the absorbed energy into heat throughout the dielectric, thereby attenuating ESD and EMI signals. As will be appreciated, lossy dielectrics are dielectric materials characterized by a nonzero loss tangent. Particularly preferred lossy glass dielectrics comprise Corning's 0081™ and Owens-Illinois R-6™ glasses.

Figure 9:
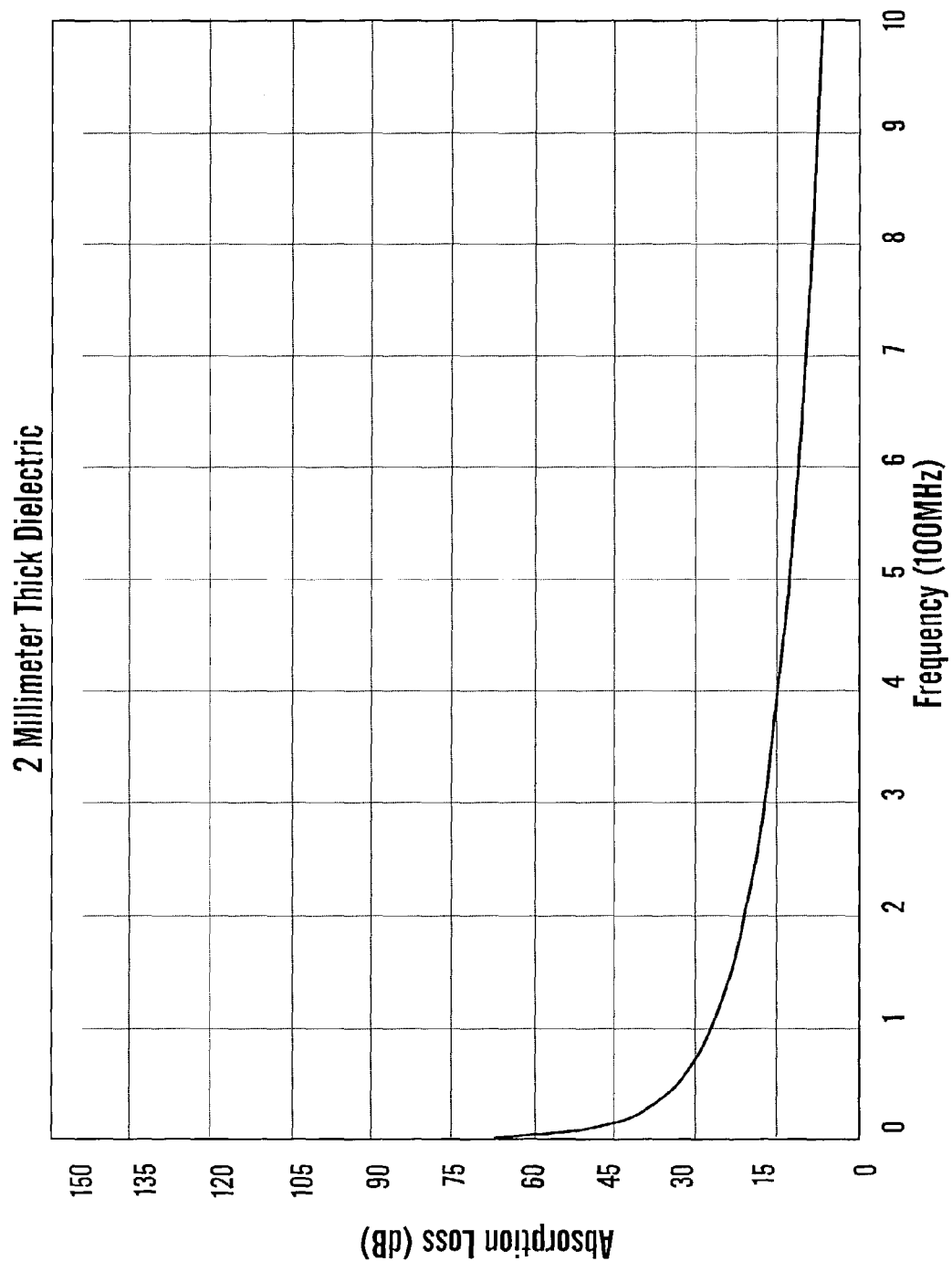
FIG. 9 is a plot of absorption loss (vertical axis) versus frequency for a 2 mm thick dielectric useful in the mitigation module of the present invention.

FIG. 9 shows the absorption loss as a function of frequency using a 2 mm thick lossy dielectric. The lossy dielectric used to generate the test results is Corning's 0081 glass. For high frequencies up to 1 GHz, the lossy dielectric provides roughly an additional 7 to 8 db of suppression and the attenuation or absorption increases with lower frequencies. Thus, lossy dielectrics provide significant attenuation levels over a relatively wide frequency range.

Figure 8:
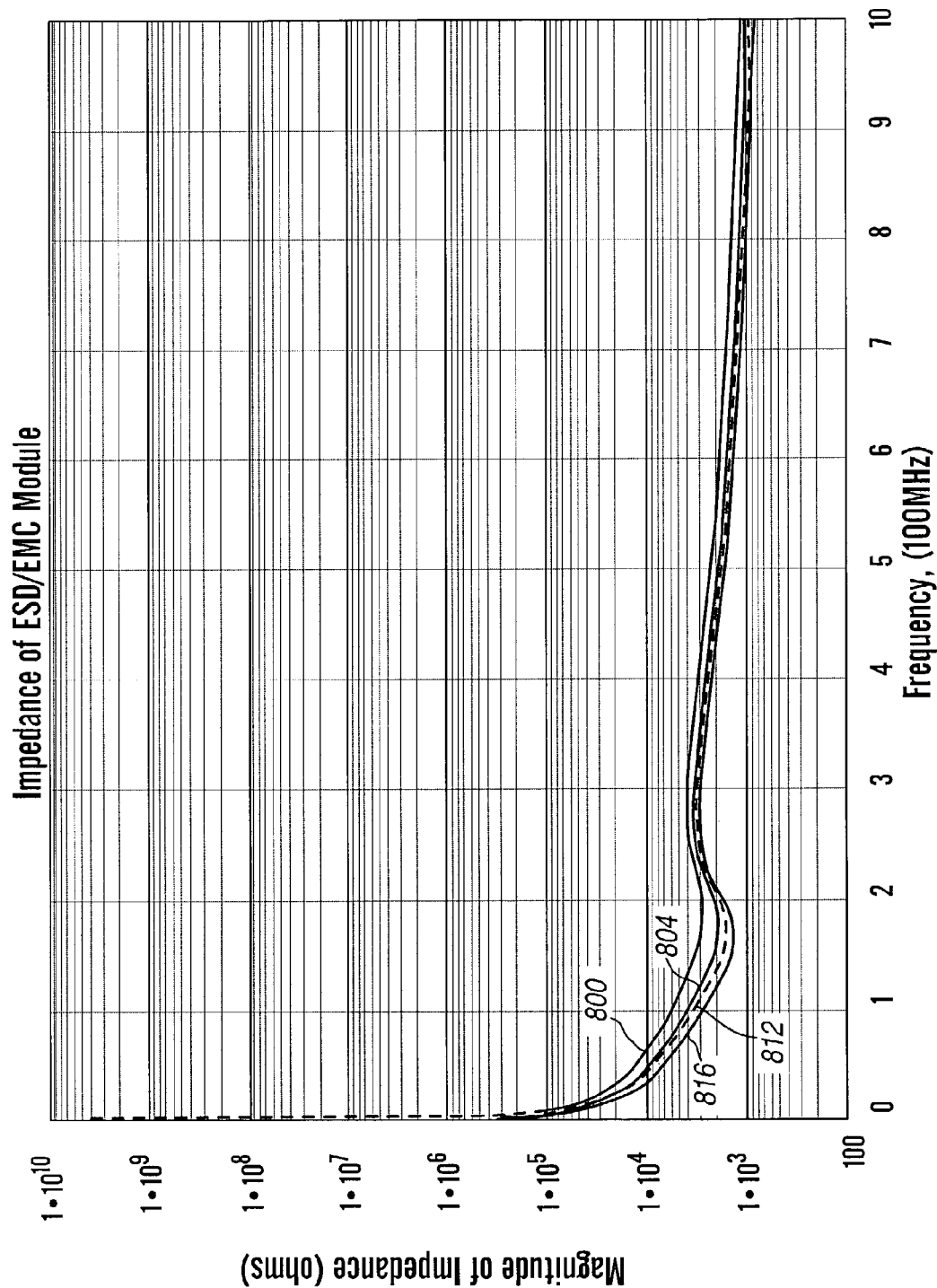
FIG. 8 is a plot of impedance (vertical axis) versus frequency (horizontal axis) for the mitigation module of FIG. 3.

FIG. 8 shows the impedance performance of the module 300 of FIG. 4 as a function of frequency for four different geometries of the module. The first module geometry denoted by curve 800 was comprised of capacitor geometries yielding 0.5 pF for both capacitors and a ferrite geometry yielding a peak resonant impedance of 2450 ohms at 247 MHz for the combination of both ferrite cylinders. These values reflect the expected geometries for the module. Maintaining the ferrite geometry, curves 804, 812 and 816 reflect the expected module impedances for capacitor geometries yielding 0.7 pF, 0.8 pF, and 0.9 pF, respectively, for both capacitors. FIG. 8 shows that impedance values of between about 1,000 ohms and 1,000,000 ohms over a wide frequency range (from 0 Hz or DC to 1,000 MHZ) can be realized using the various modules. Thus, for ESD signals (which typically have a frequency up to about 30 MHZ) the module provides a high impedance while for EMI signals (which typically comprise frequencies above about 30 MHZ the module provides a lower, but still significant, impedance.

Figure 10:
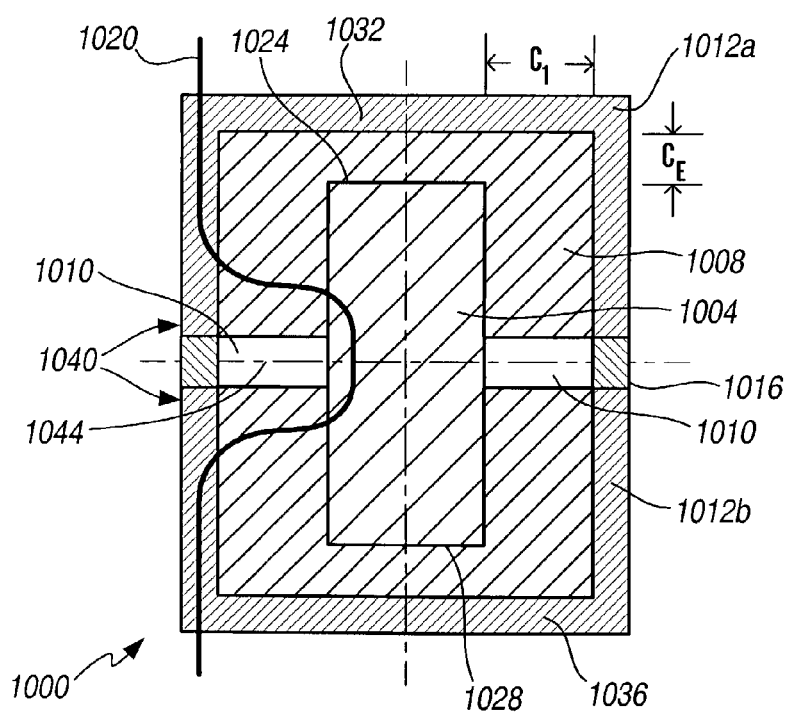
FIG. 10 is a cross-sectional view of a second embodiment of a mitigation module according to the present invention.

FIG. 10 shows a second embodiment of a module according to the present invention that is particularly useful as a surface mountable module design that can be used in a tape-and-reel installation technique. The module 1000 comprises co-axially aligned (continuous) ferrite core 1004, dielectric material 1008, first and second outer conductive shells 1012*a* and *b*, and insulative (annular) spacer ring 1016. A washer-shaped air gap 1010 (or insulative material) exists that is coplanar with the insulative annular ring. This air gap physically separates the two dielectric materials of the two capacitors and provides a much smaller capacitance than that capacitance provided by the conductive shell-dielectric-ferrite structure. As will be appreciated, the air gap 1010 and ring 1016 can be placed by a washer-shaped insulative annular ring extending from the outer surface of the shells 1012*a* and *b* to the outer surface of the core 1004. This design can be more manufacturable than an air gap and provide a high degree of mechanical stability to the overall structure. The path of the ESD/EMI currents through the module 1000 is shown by line 1020. To provide this path, the upper and lower ends 1024 and 1028 ferrite core 1004 are each spaced from the corresponding upper and lower ends 1032 and 1036 of the conductive outer shell 1040. Each of the capacitances $C_E$ between the upper end of the conductive shell 1032 and the upper end 1024 of the ferrite core and between the lower end of the conductive shell 1028 and the lower end 1028 of the ferrite core are selected to be less than the capacitance $C_1$ between the outer conductive shell 1012*a,b* and ferrite core 1004 to cause the ESD/EMI currents to follow the path shown. The insulative ring 1016 preferably is an insulator having a resistivity that is at least about 100,000 billion ohm-meters.

The module 1000 can be fabricated in separate parts joined together along joint line 1044 as shown in FIG. 10. Alternatively, the module 1000 can be fabricated as an integral unit in which case the ferrite core would be a single-piece design.

The module 1000 can be placed onto the PCB in the desired location using tape-and-reel techniques. In this technique, the module 1000 is located on a tape that is spooled on a reel. A robotic unit using suction removes the module from the tape and places it on solder prelocated on the PCB. The board is then passed through an oven to metallurgically set the solder.

In other configurations, the module is mounted on one or more of standoffs or is incorporated into the design of the standoff itself. Such configurations are depicted in FIGS. 11–13.

Figure 11:
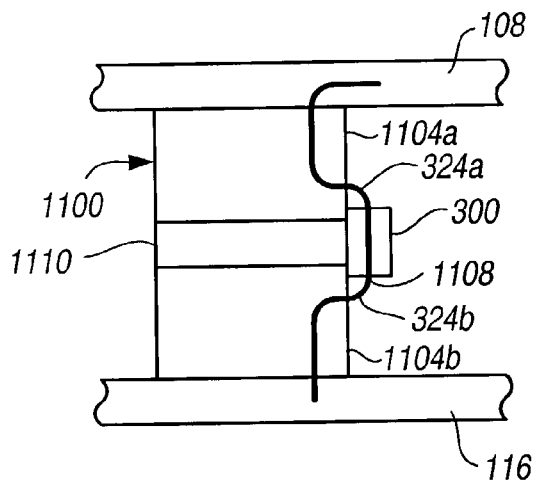
FIG. 11 is a side view of a PCB mounting design according to a third embodiment of the present invention.

FIG. 11 depicts a PCB mounting design according to a third embodiment of the present invention. In the design, the PCB ground plane 108 is in contact with standoff 1100, which in turn is in contact with the chassis 116. The first and second sections 1104*a* and 1104*b* of the standoff are electrically conductive while the central section 1110 of the standoff is electrically insulating. The mitigation module 300 or 1100 is positioned adjacent to the central section 1108 and is in electrical contact with the first and second sections 1104*a* and 1104*b*. This configuration of components produces the electromagnetic current path 1108 shown.

Figure 12:
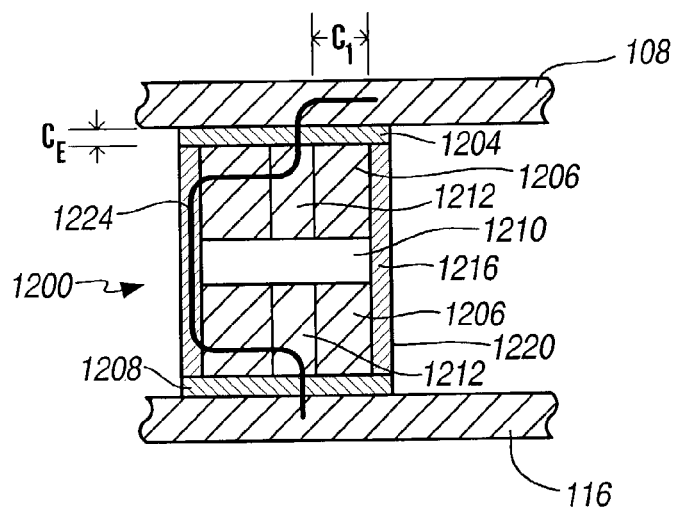
FIG. 12 is a cross-sectional view of a PCB mounting design according to a fourth embodiment of the present invention.

FIG. 12 depicts a PCB mounting design according to a fourth embodiment of the present invention. In the design, the PCB ground plane 108 is in contact with standoff 1200, which in turn is in contact with the chassis 116. The first and second annular end sections 1204 and 1208 of the standoff are electrically insulative. The standoff 1200 further includes a cylindrical ferrite core 1212 (which has a resistivity not exceeding 10,000 ohm-meters), an annular-shaped dielectric material 1216 positioned around the periphery of the upper and lower sections of the ferrite core 1212, and a cylindrical conductive outer shell 1220 and upper and lower sections of the dielectric materials 1206 positioned around the periphery of the upper and lower sections of the ferrite core 1212 and between the first and second annular sections 1204 and 1208. An air gap 1210 separates the upper and lower sections of the dielectric and ferrite materials. Instead of an air gap, an insulative spacer can be used to fill the intervening space. The spacer preferably has a resistivity of at least about 100,000 billion ohms. The capacitances $C_E$ between the ground plane 108 and the outer shell 1220 and between the chassis 116 and the outer shell 1220 are each less than the capacitance $C_1$. The electromagnetic current path 1224 resulting from the component arrangement is depicted in the figure.

Figure 13:
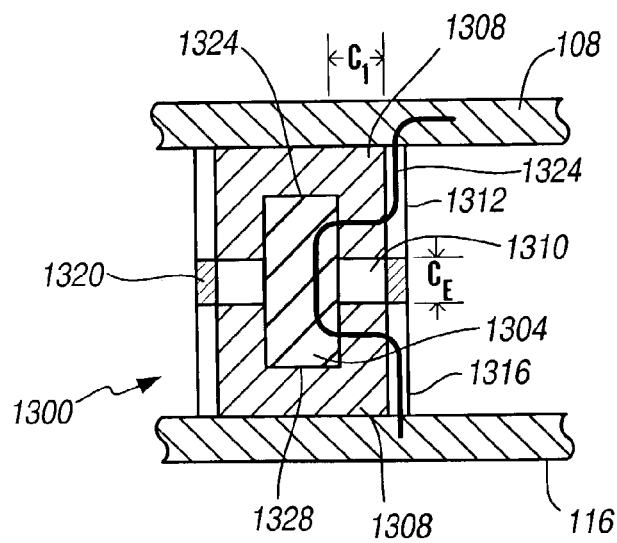
FIG. 13 is a cross-sectional view of a PCB mounting design according to a fifth embodiment of the present invention.

FIG. 13 depicts a PCB mounting design according to a fifth embodiment of the present invention. In the design, the PCB ground plane 108 is in contact with standoff 1300, which in turn is in contact with the chassis 116. The standoff 1300 includes a continuous cylindrical ferrite core 1304, a spaced-apart annular-shaped upper and lower sections of dielectric material 1308 positioned around the periphery of the ferrite core 1304, first and second cylindrical conductive outer shells 1312 and 1316 positioned around the periphery of the ferrite core, and an annular electrically insulative spacer ring 1320 (which has a volume resistivity higher than the ferrite core 1304) positioned between the first and second outer shells 1312 and 1316 and washer-shaped air gap (or washer-shaped insulative material having a resistivity similar to the insulative spacer discussed in the previous paragraph) 1310 positioned between the upper and lower sections of the dielectric material to produce the electromagnetic current path 1324 shown. The capacitance $C_E$ between the first and second outer shells 1312 and 1316 and the capacitances between the ground plane 108 and the first end 1324 of the ferrite core 1308 and between the chassis 116 and the second end 1328 of the ferrite core 1308 are each less than the capacitance $C_1$. This design can provide a high degree of mechanical stability to the overall structure.

A number of other variations and modifications of the invention can be used. It would be possible to provide for some features of the invention without providing others.

For example in one alternative embodiment, the module 300, 1000, 1100, 1200 and 1300 has a geometry other than cylindrical. In one configuration, for example, the module has a polygonal (e.g., rectangular or cubic) geometry.

In another embodiment, the composition(s) of the ferrite and/or dielectric materials in the first portion 320a of the module is different from the composition(s) of the corresponding ferrite and/or dielectric material in the second portion 320b (FIG. 4) of the module. In this configuration for example, the capacitances for the two capacitors 504 and 508 (FIG. 5) are different and/or the corresponding values for R, $C_2$, and/or L in the circuit segments 512 and 516 are different.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g., for improving performance, achieving ease and/or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A module for mitigating at least one of an electrostatic discharge and electromagnetic interference, comprising:
   an outer electrically conductive sidewall comprising a conductive material;
   a ferrite material spaced apart from and located interiorly of the sidewall; and
   a dielectric material located between the sidewall and the ferrite material, wherein first and second capacitances are defined, respectively, between first and second portions of the ferrite material and first and second spaced apart portions of the conductive material, the first portion of the ferrite material being spaced from the first portion of the conductive material and the second portion of the ferrite material being spaced from the second portion of the conductive material and a third capacitance is defined between the first and second spaced apart portions of the ferrite material and wherein each of the first and second capacitances is greater than the third capacitance.

2. The module of claim 1, wherein an equivalent electrical circuit for at least part of the mitigation module comprises at least a first circuit segment comprising at least a first inductor and a first capacitor electrically connected in parallel and at least a second capacitor electrically connected in series with the first circuit segment.

3. The module of claim 1, wherein the module is electrically coupled to at least one of a ground plane of a printed circuit board and at least part of an enclosure surrounding the printed circuit board.

4. The module of claim 1, the ferrite material is at least one of a manganese-based and zinc-based.

5. The module of claim 3, wherein the ferrite material is located between and spaced apart from each of the ground plane and the at least part of the enclosure.

6. The module of claim 1, wherein the dielectric material is a lossy dielectric material.

7. The module of claim 6, wherein the lossy dielectric material is at least one of a ceramic material and glass.

8. The module of claim 2, wherein the first circuit segment is defined by the ferrite material.

9. The module of claim 2, wherein the second capacitor is defined by the outer conductive wall, the ferrite material, and a dielectric material positioned between the outer conductive wall and the ferrite material.

10. The module of claim 1, wherein the module comprises first and second stacked sections, with each stacked section comprising a portion of the ferrite material, a portion of the dielectric material, and a portion of the outer conductive wall.

11. The module of claim 10, wherein the first portion of the ferrite material in the first section is spaced apart from the second portion of the ferrite material in the second section.

12. The module of claim 11, wherein the first and second sections are separated by a conductive spacer ring.

13. The module of claim 1, wherein the outer conductive wall comprises a sidewall and endwalls and wherein the ferrite material is spaced apart from the sidewall and the end walls.

14. The module of claim 13, wherein the module comprises first and second spaced apart sidewall sections comprising respectively the first and second portions of the conductive material and an insulative spacer ring located between the first and second spaced apart sidewall sections.

15. The module of claim 1, wherein the module is positioned between and in contact with the first and second electrical conductors and comprises first and second insulative annular spacer rings, wherein the ferrite passes through the annuli of the first and second insulative spacer rings and is in electrical contact with the first and second electrical conductors, and wherein the first and second insulative annular spacer rings separate the dielectric material and the outer conductive wall from the first and second electrical conductors.

16. The module of claim 12, wherein the module is positioned between and in contact with the first and second electrical conductors.

17. In an assembly comprising at least first and second spaced apart electrical conductors and a mitigation module electrically coupled to at least one of the first and second spaced apart electrical conductors to mitigate a magnitude of at least one of an electrostatic discharge and electromagnetic interference in at least one of the first and second electrical conductors, the mitigation module including a ferrite material, a lossy dielectric material, and a conductive material, a method comprising:
 when the at least one of an electrostatic discharge and electromagnetic interference is passed through the mitigation module, the following substeps are performed:
  (a) passing the at least one of an electrostatic discharge and electromagnetic interference through the conductive material;
  (b) thereafter passing the at least one of an electrostatic discharge and electromagnetic interference through the lossy dielectric material; and
  (c) thereafter passing the at least one of an electrostatic discharge and electromagnetic interference through the ferrite material.

18. The method of claim 17, wherein the first electrical conductor is a ground plane of a printed circuit board and the second electrical conductor is at least part of an enclosure surrounding the printed circuit board and wherein an equivalent electrical circuit for at least part of the mitigation module comprises at least a first circuit segment comprising at least a first inductor and a first capacitor electrically connected in parallel and at least a second capacitor electrically connected in series with the first circuit segment.

19. The method of claim 17, further comprising before substep (a):
 passing the at least one of an electrostatic discharge and electromagnetic interference through the ferrite material;
 thereafter passing the at least one of an electrostatic discharge and electromagnetic interference through the lossy dielectric material.

20. The method of claim 17, the ferrite material is at least one of a manganese-based and zinc-based.

21. The method of claim 17, wherein in the module the ferrite material is spaced apart from an outer conductive wall of the module.

22. The method of claim 21, wherein the ferrite material is spaced apart from each of the first and second electrical conductors.

23. The method of claim 17, further comprising after substep (c):
 (d) passing the at least one of an electrostatic discharge and electromagnetic interference through the lossy dielectric material;
 (e) thereafter passing the at least one of an electrostatic discharge and electromagnetic interference through the conductive material.

24. The method of claim 17, wherein the lossy dielectric material is at least one of a ceramic material and glass.

25. The method of claim 17, wherein first and second capacitances are defined, respectively, between first and second portions of the ferrite material and first and second spaced apart portions of the conductive material, the first portion of the ferrite material being spaced from the first portion of the conductive material and the second portion of the ferrite material being spaced from the second portion of the conductive material and a third capacitance is defined between the first and second spaced apart portions of the ferrite material and wherein each of the first and second capacitances is greater than the third capacitance.

26. The method of claim 18, wherein the first circuit segment is defined by the ferrite material.

27. The method of claim 26, wherein the second capacitor is defined by an outer conductive wall of the module spaced apart from the ferrite material and the dielectric material positioned between the outer conductive wall and the ferrite material and wherein the outer conductive wall comprises the conductive material.

28. The method of claim 27, wherein the module comprises first and second stacked sections, with each stacked section comprising a portion of the ferrite material, a portion of the dielectric material, and a portion of the outer conductive wall.

29. The method of claim 28, wherein the portion of the ferrite material in the first section is spaced apart from the portion of the ferrite material in the second section.

30. The method of claim 29, wherein the first and second sections are separated by a conductive spacer ring.

31. The method of claim 30, wherein the outer conductive wall comprises a sidewall and endwalls and wherein the ferrite material is spaced apart from the sidewall and the end walls.

32. The method of claim 31, wherein the module comprises first and second spaced apart sidewall sections and an insulative spacer ring located between the first and second spaced apart sidewall sections.

33. The method of claim 27, wherein the module is positioned between and in contact with the first and second electrical conductors and comprises first and second insulative annular spacer rings, wherein the ferrite passes through the annuli of the first and second insulative spacer rings and is in electrical contact with the first and second electrical conductors, and wherein the first and second insulative annular spacer rings separate the dielectric material and the outer conductive wall from the first and second electrical conductors.

34. The method of claim 32, wherein the module is positioned between and in contact with the first and second electrical conductors.

35. An assembly for mitigating at least one of an electrostatic discharge and electromagnetic interference, comprising:
 at least first and second spaced apart electrical conductors; and
 a mitigation module electrically coupled to at least one of the first and second spaced apart electrical conductors to control a magnitude of at least one of an electrostatic discharge and electromagnetic interference in at least one of the first and second electrical conductors, wherein the mitigation module comprises a ferrite material; and a lossy dielectric material and wherein a conductive material and first and second capacitances are defined, respectively, between first and second portions of the ferrite material and first and second spaced apart portions of the conductive material, the first portion of the ferrite material being spaced from the first portion of the conductive material and the second portion of the ferrite material being spaced from the second portion of the conductive material and a third capacitance is defined between the first and second spaced apart portions of the ferrite material and wherein each of the first and second capacitances is greater than the third capacitance.

36. The assembly of claim 35, wherein the first electrical conductor is a ground plane of a printed circuit board and the second electrical conductor is at least part of an enclosure surrounding the printed circuit board.

37. The assembly of claim 35, wherein an equivalent electrical circuit for at least part of the mitigation module comprises at least a first circuit segment comprising at least a first inductor and a first capacitor electrically connected in parallel and at least a second capacitor electrically connected in series with the first circuit segment.

38. The assembly of claim 37, the ferrite material is at least one of a manganese-based and zinc-based.

39. The assembly of claim 37, wherein in the module the ferrite material is spaced apart from an outer conductive wall of the module.

40. The assembly of claim 39, wherein the ferrite material is spaced apart from each of the first and second electrical conductors.

41. The assembly of claim 35, wherein the first and second capacitances are approximately equivalent.

42. The assembly of claim 35, wherein the lossy dielectric material is at least one of a ceramic material and glass.

43. The assembly of claim 35, wherein the lossy dielectric material is positioned between the first and second portions of the ferrite material and the first and second portions of the conductive material.

44. The assembly of claim 37, wherein the first circuit segment is defined by a ferrite material.

45. The assembly of claim 44, wherein the second capacitor is defined by an outer conductive wall of the module spaced apart from the ferrite material and a dielectric material positioned between the outer conductive wall and the ferrite material.

46. The assembly of claim 45, wherein the module comprises first and second stacked sections, with each stacked section comprising a portion of the ferrite material, a portion of the dielectric material, and a portion of the outer conductive wall.

47. The assembly of claim 46, wherein the portion of the ferrite material in the first section is spaced apart from the portion of the ferrite material in the second section.

48. The assembly of claim 47, wherein the first and second sections are separated by a conductive spacer ring.

49. The assembly of claim 46, wherein the outer conductive wall comprises a sidewall and endwalls and wherein the ferrite material is spaced apart from the sidewall and the end walls.

50. The assembly of claim 49, wherein the module comprises first and second spaced apart sidewall sections and an insulative spacer ring located between the first and second spaced apart sidewall sections.

51. The assembly of claim 45, wherein the module is positioned between and in contact with the first and second electrical conductors and comprises first and second insulative annular spacer rings, wherein the ferrite passes through the annuli of the first and second insulative spacer rings and is in electrical contact with the first and second electrical conductors, and wherein the first and second insulative annular spacer rings separate the dielectric material and the outer conductive wall from the first and second electrical conductors.

52. The assembly of claim 35, wherein the module is positioned between and in contact with the first and second electrical conductors.

* * * * *